(12) United States Patent
Bellaouar et al.

(10) Patent No.: US 7,061,989 B2
(45) Date of Patent: Jun. 13, 2006

(54) FULLY DIGITAL TRANSMITTER INCLUDING A DIGITAL BAND-PASS SIGMA-DELTA MODULATOR

(75) Inventors: Abdellatif Bellaouar, Richardson, TX (US); Paul-Aymeric Fontaine, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 10/856,217

(22) Filed: May 28, 2004

(65) Prior Publication Data

US 2005/0265481 A1    Dec. 1, 2005

(51) Int. Cl.
    *H04L 27/04*    (2006.01)
    *H04L 27/12*    (2006.01)
    *H04L 27/20*    (2006.01)
(52) U.S. Cl. ............... 375/295; 375/297; 375/298; 375/259; 375/261; 330/264; 341/143
(58) Field of Classification Search .......... 375/297, 375/295, 298, 259, 261; 330/264, 251; 341/143
    See application file for complete search history.

(56) References Cited

U.S. PATENT DOCUMENTS

| 5,977,896 | A  * | 11/1999 | Kohdaka et al. ......... 341/143 |
| 6,198,347 | B1 * | 3/2001  | Sander et al. ........... 330/251 |
| 6,462,620 | B1 * | 10/2002 | Dupuis et al. ........... 330/264 |
| 2004/0036638 | A1 * | 2/2004 | Lipka ................... 341/143 |
| 2004/0037363 | A1 * | 2/2004 | Norsworthy et al. ...... 375/259 |
| 2005/0088326 | A1 * | 4/2005 | Jelonnek ................ 341/143 |

FOREIGN PATENT DOCUMENTS

WO  WO-03/077489 A1  9/2003
WO  WO-03/077529 A2  9/2003

* cited by examiner

*Primary Examiner*—Phuong Phu
(74) *Attorney, Agent, or Firm*—Ronald O. Neerings; James Wade Brady, III; Frederick J. Telecky, Jr.

(57) ABSTRACT

A digital transmitter (20) that may be advantageously used in a high-frequency transceiver, such as a wireless telephone handset, is disclosed. The transmitter (20) includes digital upconverter functions (36I, 36Q) that operate in combination with a digital band-pass sigma-delta modulator (40) to generate modulated digital signals at a sample frequency that is a multiple of the transmit frequency. The digital band-pass sigma-delta modulator (40) applies a noise transfer function in a feedback filter (72) in which the center of the pass band corresponds to the transmit frequency, and in which notches in the characteristic can be symmetrically or asymmetrically selected to correspond to specific frequencies, such as the receive band frequency, in which transmit noise is to be minimized. A combined FIR digital filter (42) and MOS power switch array (44) is also disclosed, in which a cascode arrangement of drain-extended MOS power transistors (78) and switching transistors (82) provide the output RF signal, with a coarse gain control (80) applied.

31 Claims, 6 Drawing Sheets

FULLY DIGITAL TRANSMITTER INCLUDING A DIGITAL BAND-PASS SIGMA-DELTA MODULATOR

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of transmitter and receiver circuitry, and is more specifically directed to full duplex transceiver circuitry such as used in modern mobile telephone handsets.

Mobile telephone technology has greatly advanced in recent years, as evident by the higher performance digital mobile telephones now available. To a large extent, these advances stem from the widespread deployment of modern digital wireless modulation technologies such as time division multiple access (TDMA), code division multiple access (CDMA) technologies including conventional CDMA, wideband CDMA (WCDMA), and CDMA2000 standards, and personal communications service (PCS) modulation. The carrier frequencies for these modulated signals ranges from on the order of 800 MHz to as high as 2.0 GHz. These and other digital modulation and communications techniques have greatly improved wireless telephone services, at reduced cost to the consumer.

The circuitry required for carrying out such high-frequency modulation and communication has become increasingly complex. Despite this increasing complexity, there remains significant pressure to further reduce hardware cost. One can reduce cost by reducing the number of integrated circuits and other electronic components used to realize a wireless telephone, as well as by reducing the cost of these integrated circuits by reducing their chip area. However, conventional transceiver circuitry still relies to a large extent on analog circuitry, especially in transmitting and receiving radio frequency (RF) signals. This analog circuitry and passive components such as inductors that are typically required in the analog domain, has limited the extent to which cost reduction and performance improvements, both in operational speed and also reduced power dissipation, can be attained.

Figure 1:
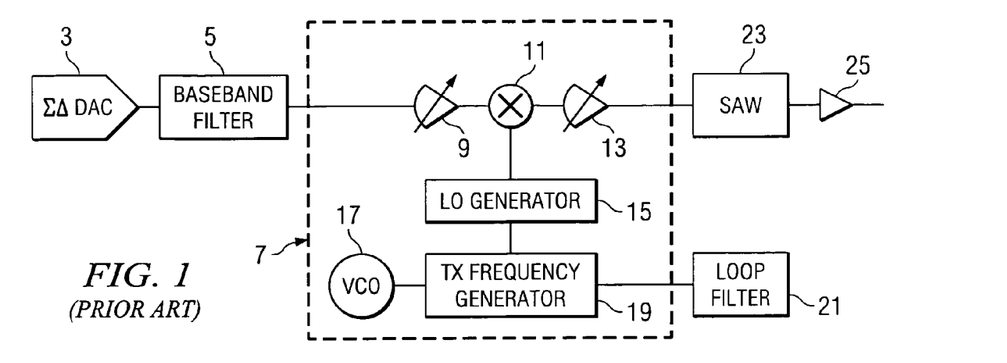
FIG. 1 is an electrical diagram, in block form, of a conventional analog RF transmitter.

FIG. 1 illustrates a conventional architecture for a transmitter in a modern wireless telephone transceiver (transmitter/receiver). As shown in FIG. 1, the digital baseband signal to be transmitted is converted to the analog domain by sigma-delta digital-to-analog converter (DAC) 3. The resulting analog filter is filtered by integrated baseband analog filter 5, and is applied to analog modulator 7. In this conventional architecture, such as is typical for CDMA and WCDMA communications, analog modulator 7 includes first automatic gain control (AGC) function 9, which applies a gain of on the order of 25 to 30 dB prior to analog mixing of the baseband signal with a local oscillator (LO) clock at mixer 11. Typically, mixer 11 is a quadrature mixer, and as such both in-phase (I) and quadrature-phase (Q) components are generated. The LO clock is generated by local oscillator 15, which receives the output of transmit frequency generator function 19. Transmit frequency generator function 19 generates a transmit clock signal based on the output of a voltage-controlled oscillator (VCO) 17 as filtered by loop filter 21. The quadrature output of mixer 11 is applied to second AGC function 13, which applies a 60 dB nominal gain to the signal. Filtering by SAW filter 23 is applied to the output modulated signal, prior to amplification by power amplifier 25.

In this conventional architecture, much of the signal processing is performed in the analog domain. Specifically relative to FIG. 1, the analog domain begins with the output of DAC 3, and continues through analog modulator 7 and power amplifier 25. Because of this large extent of analog processing, the circuitry typically requires several passive components. For the example of the conventional transmitter of FIG. 1, several inductors are necessary, including at the power amplifier stage 25, as well as with analog mixer 11, and also in other circuits within the transmitter. As known in the art, such inductors either must be implemented by external components, or are at best require large chip area if integrated. Other circuits, for example loop filter 21, involve external components (e.g., two resistors and three capacitors).

Analog AGC functions 9 and 13 in this conventional analog transmitter architecture also present issues both in realization and also in operation. As known in the art, the gains applied by AGC functions 9, 13 must be properly calibrated because of their sensitivity to manufacturing process variations and also to operating temperature. This AGC calibration typically involves significant test and characterization time in the manufacturing flow.

As is well known in the art, both the transmitted and received signals occupy the same frequencies in full duplex communications, such as are carried out according to the CDMA and WCDMA standards. Indeed, the largest source of noise in the received signal at a conventional transceiver is typically the leakage from the signals that the transceiver is itself transmitting. However, it has been observed that conventional analog transmitters cannot be constructed to have particularly low receive band noise, particularly if the manufacturing cost is to be kept reasonable (including using reasonable numbers of passive components).

Perhaps most importantly, the analog nature of much of the circuitry of the conventional transmitter of FIG. 1 makes it is difficult to highly integrate this transmitter into a single integrated circuit. Further, as is well known in the art, analog circuitry cannot be readily realized by low-voltage complementary metal-oxide-semiconductor (CMOS) technology. Rather, analog circuitry typically requires bipolar transistors, or at least a combination of bipolar and CMOS devices (e.g., BiCMOS technology), which is expensive from an integrated circuit manufacturing cost standpoint. Bipolar transistors are not as readily scalable as CMOS devices, and as such it is contemplated that the integration efficiency that would be attained by CMOS integrated circuits in the future will not be available to analog circuits utilizing bipolar or BiCMOS technology.

BRIEF SUMMARY OF THE INVENTION

It is therefore an object of this invention to provide a fully digital architecture for a radio frequency (RF) transmitter.

It is a further object of this invention to provide such a digital transmitter architecture that is particularly well-suited for implementation according to scaled low-voltage complementary metal-oxide-semiconductor (CMOS) technology.

It is a further object of this invention to provide such a digital transmitter architecture that can be integrated with digital baseband processing circuitry so that a single-chip realization of the electronics for a wireless telephone handset can be achieved.

It is a further object of this invention to provide such a digital transmitter architecture that has very low receive band noise.

It is a further object of this invention to provide such a digital transmitter architecture in which the out-of-band noise notches can be tuned asymmetrically about the center transmit frequency.

It is a further object of this invention to provide such a digital transmitter architecture in which high-band transmit frequencies, such as 2 GHz or higher, can be realized.

It is a further object of this invention to provide such a digital transmitter architecture in which the power amplifier driver circuitry can be integrated with digital automatic gain control (AGC) circuitry.

It is a further object of this invention to provide a digital band-pass sigma-delta modulator.

Other objects and advantages of this invention will be apparent to those of ordinary skill in the art having reference to the following specification together with its drawings.

The present invention may be implemented into a fully digital transmitter architecture in which all functions including an upconverter mixer and oversampled digital band-pass sigma-delta modulator are implemented by digital circuitry. The upconverter mixer, according to this invention, is realized by a simple multiplexer and inverter arrangement.

According to another aspect of the invention, the digital band-pass sigma-delta modulator includes a zero-splitting capability, so that transmit noise leakage into nearby frequency bands, such as the receive band in a transceiver, can be controlled. The digital band-pass sigma-delta modulator, according to this invention, is realized by a digital filter arrangement in which the feedback characteristic defines the zero frequencies.

According to another aspect of the invention, finite impulse response (FIR) digital filtering is combined with coarse gain control and power amplifier driver circuitry into an array of delayed drive stages, with the outputs summed to drive the power amplifiers.

DETAILED DESCRIPTION OF THE INVENTION

The present invention will be described in connection with its preferred embodiment, namely as implemented into a digital transceiver, such as may be used in connection with a wireless telephone handset, because it is contemplated that this application of the invention will especially benefit from its advantages. However, it is also contemplated that other applications of this invention can also benefit from its advantages. Accordingly, it is to be understood that the following description is provided by way of example only, and is not intended to limit the true scope of this invention as claimed.

Figure 2:
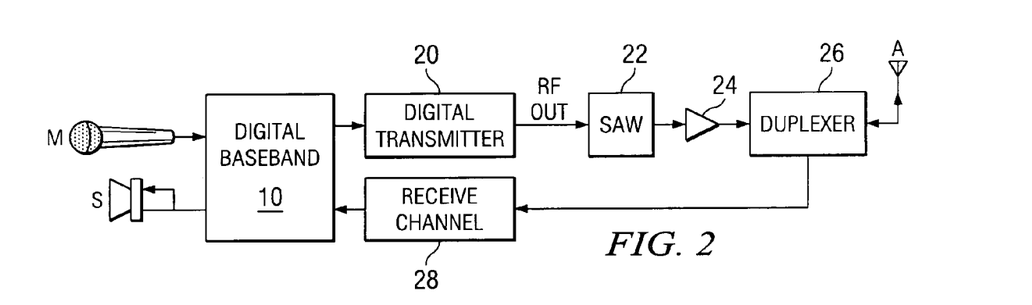
FIG. 2 is an electrical diagram, in block form, of a digital transceiver architecture according to the preferred embodiments of the invention.

Referring first to FIG. 2, a communications system into which each of the preferred embodiments of this invention way be implemented will now be described. In the example of FIG. 2, the system is a wireless telephone handset, and as such includes microphone M coupled to provide signals to digital baseband processor 10 and then to digital transmitter 20, and speaker S that is coupled to receive signals from receive channel 28 via digital baseband processor 10. Functionally, additional circuitry and functionality will also typically be implemented into the system, such functions including a controller for overall control of the system, input/output by way of a keypad and LCD display. In the signal path, digital baseband processor 10 includes circuitry and functionality for performing analog and digital filtering, channel and error correction coding, and the like on the signals prior to modulation (and thus still at "baseband" frequencies). Typically, modern wireless telephone handsets include such high level integrated circuits as the OMAP24xx processor available from Texas Instruments Incorporated, such a processor including core engines such as an ARM11 processor and a TMS320C55x digital signal processor (DSP), serving as digital baseband processor 10.

On the transmit side, digital transmitter 20 receives processed signals from digital baseband processor 10, the processed signals corresponding to the analog audio signals from microphone M. The construction of digital transmitter 20 according to the preferred embodiments of the invention will be described in further detail below. Digital transmitter 20 generates an RF output signal that is filtered by surface acoustic wave (SAW) filter 22, and amplified by power amplifier 24 for transmission over antenna A via duplexer 26. The receive side of this system is illustrated by receive channel 28, which receives RF signals from antenna A via duplexer 26, and which demodulates and processes these received signals in the conventional manner into baseband signals, following which digital baseband processor 10 further processes the received signals into a form suitable for output over speaker S.

According to the preferred embodiments of the invention, it is contemplated that the construction of digital transmitter 20 can be realized in a transistor and device technology that renders it suitable for implementation in the same integrated Circuit as digital baseband processor 10, for example complementary metal-oxide-semiconductor (CMOS) technology. Realization of digital transmitter 20 in CMOS will enable the scaling, with smaller transistor critical features, of digital transmitter 20 along with conventional digital circuitry such as digital baseband processor 10, leading to continued performance improvements and continued cost reduction. Conventional transmitter circuitry, such as described above relative to FIG. 1, typically requires bipolar or BiCMOS technology, and as such cannot be readily scaled along with conventional digital baseband processors.

In addition, it is also contemplated that digital transmitter 20 constructed according to the preferred embodiments of the invention can provide reduced noise in the receive band. This improved receive band noise performance of digital transmitter 20 will relax the requirements of SAW filter 22, further reducing the cost of the overall system; in addition, reduction in receive band noise will improve the fidelity of the signal received and processed by receive channel 28. Furthermore, the fully digital operation of digital transmitter 20 enables digital control of automatic gain control (AGC) functions, eliminating the need for analog AGC calibration as required by conventional RF transceivers.

Figure 3:
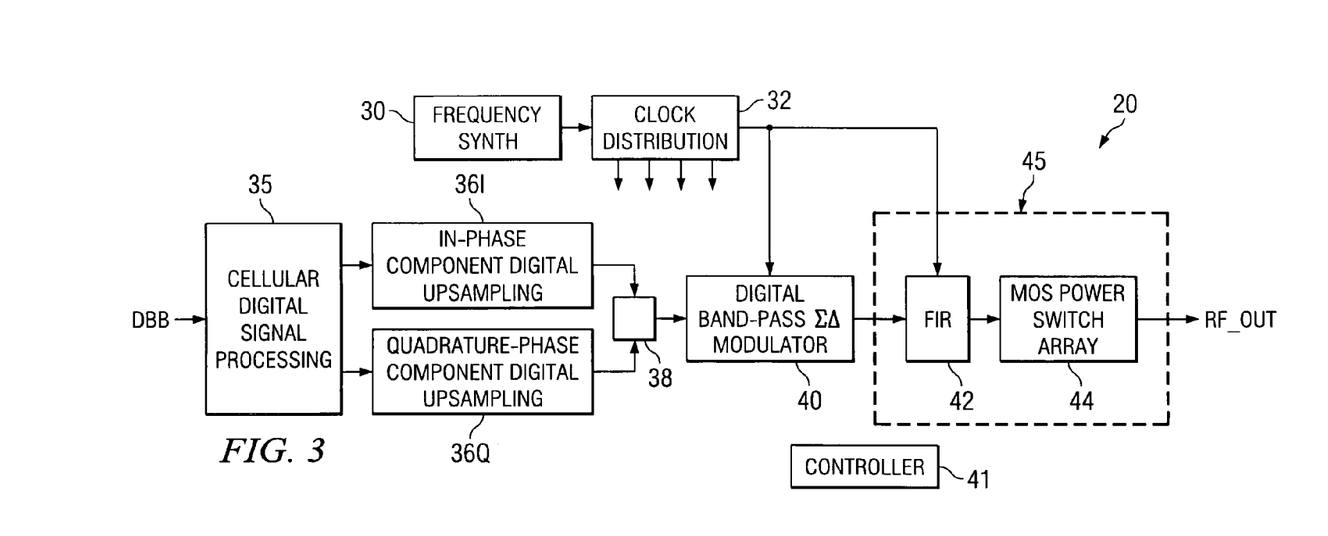
FIG. 3 is an electrical diagram, in block form, of the digital transmitter in the transceiver of FIG. 2, according to the preferred embodiments of the invention.

Referring now to FIG. 3, the construction of digital transmitter 20 according to the preferred embodiments of the invention will now be described. Digital baseband input signals DBB from digital baseband processor 10 (FIG. 2) are received by cellular digital signal processing function 35, which performs such functions as serial-to-parallel conversion, digital filtering, splitting of the signals into in-phase and quadrature-phase components, sample rate conversion, and the like. According to the preferred embodiments of this invention, the in-phase component of the signal to be transmitted is forwarded to in-phase digital upconverter function 36I; similarly, the quadrature-phase component of the signal to be transmitted is forwarded to quadrature-phase upconverter function 36Q. The construction and operation of in-phase and quadrature-phase digital upconverter functions 36I, 36Q according to the preferred embodiments of the invention will be described in further detail below. The outputs of in-phase and quadrature-phase digital upconverter functions 36I, 36Q are applied to inputs of adder 38, which combines the upconverted components and applies the result to digital band-pass sigma-delta modulator 40, the construction of which will also be described in further detail below. The modulated output signals from digital band-pass sigma-delta modulator 40 are filtered by finite impulse response (FIR) digital filter 42, and are the input signals applied to MOS power switch array 44. As will be described in further detail below, each bit output from digital band-pass sigma-delta modulator 40 preferably drives a combination of switches in FIR function 42 and MOS power switch array 44. As will be described below, and according to the preferred embodiments of the invention, FIR function 42 and MOS power switch array 44 are effectively combined into array 43 of hierarchical sub-units, to generate the RF output signal with coarse gain control applied.

Digital transmitter 20 also includes circuitry for generating the various clock signals used by digital upconverter functions 36I, 36Q, and by digital band-pass sigma-delta modulator 40. According to the preferred embodiments of the invention, frequency synthesizer 30 is a conventional frequency synthesizer for generating one or more clock signals of a selected frequency, typically a multiple of the ultimate transmit frequency $F_{tx}$ (e.g., 824 to 849 MHz for CDMA2K, or 1.8 to 2.0 GHz for EDGE, WCDMA, and PCS); the multiple need not be integral, as will become apparent from the following description. Clock distribution circuitry 32 distributes the output of frequency synthesizer 32 to various functions within digital transmitter 20, and may include additional frequency dividers or mixers for generating clock signals at additional frequencies, as necessary. Digital transmitter 20 also includes controller 41, which may correspond to a higher-level controller within the system of FIG. 2. Controller 41 includes programmable logic or other circuitry for controlling the operation of transmitter 20, including the selection and application of a digital gain control signal to MOS power switches 44, as will be described in further detail below.

Figure 4:
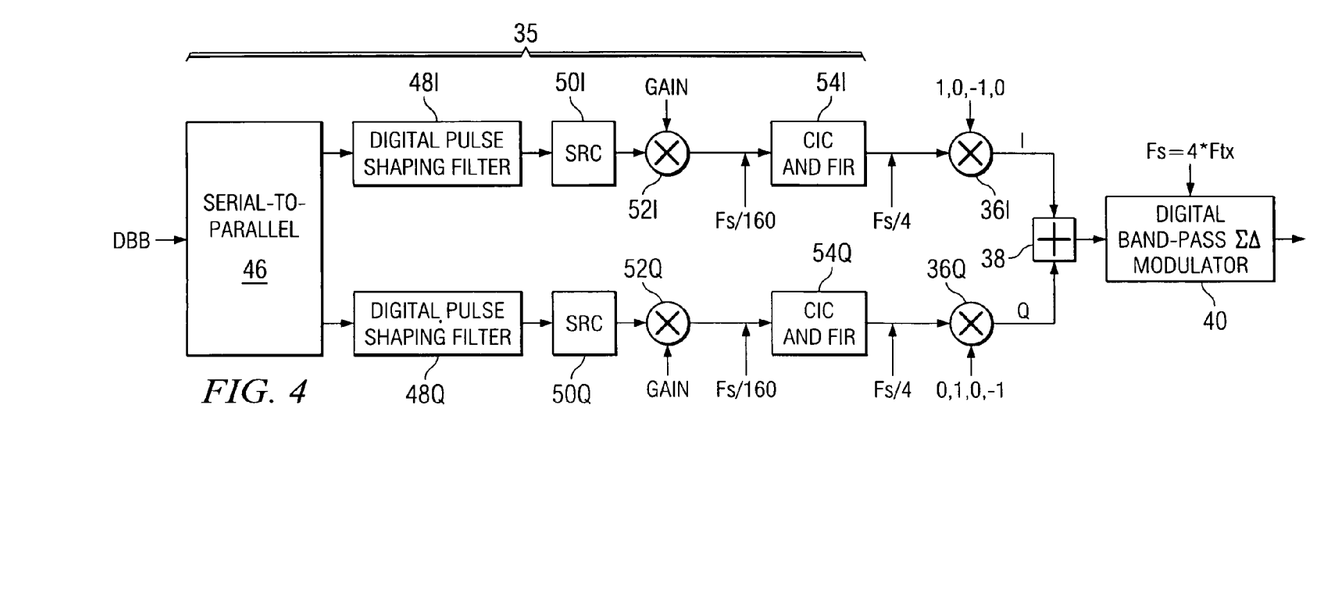
FIG. 4 is an electrical diagram, in block form, illustrating the architecture of digital upconverter and signal processing functions in the transmitter of FIG. 3 according to a first preferred embodiment of the invention.

Referring now to FIG. 4, the detailed construction of cellular digital signal processing function 35 and digital upconverter functions 36I, 36Q according to a first preferred embodiment of the invention will now be described. In this example, the transmit frequency $F_{tx}$ is 836 MHz, corresponding to the CDMA2K standard. As will become apparent from this description, this relatively high transmit frequency can be readily attained by digital transmitter 20 operating at relatively modest frequencies for modern digital circuitry.

In this first embodiment of the invention, digital baseband input signal DBB, in the form of a single-bit bitstream, is applied to serial-to-parallel converter 46. In the conventional manner, serial-to-parallel converter 46 groups the serial input bitstream into successive words, and assigns the parallel words to in-phase and quadrature-phase components. As known in the art, the particular manner in which the bitstream is split into these orthogonal components is arbitrary, so long as the receiver can reassemble the components back into intelligible information in the form of a digital baseband bitstream. The width of the parallel data words output by serial-to-parallel converter 46 will depend upon the relative clock rates in digital transmitter 20, and the ultimate transmit frequency $F_{tx}$. For the example of CDMA communications, serial-to-parallel converter 46 outputs data words ranging from six to eight bits in width, at a frequency of 4.8 MHz, for each of the in-phase and quadrature-phase components; in WCDMA communications, serial-to-parallel converter 46 may output six to eight bit wide data words at a frequency of 3.84 MHz.

The remainder of the processing of cellular digital signal processing function 35 is substantially identical between the in-phase and quadrature-phase components. Digital pulse shaping filter 48I applies a digital filter to the in-phase component and digital pulse shaping filter 48Q applies a digital filter to the quadrature-phase component. Pulse shaping filters 48 shape the spectrum of the eventual transmitted signal to within the desired transmit frequency band, and within the power spectral density (PSD) constraints of the particular communications standard.

Up to this point, at the output of digital pulse shaping filters 48I, 48Q the sample rate of the data (both as bitstream DBB and also after parallelization) is at the baseband rate. Conversion of this sample rate to a frequency that is compatible with transmit frequency $F_{tx}$ begins with sample rate converters 50I, 50Q, each of which is a conventional circuit for buffering incoming data at one rate to output the data at another rate. In this example, the rate of the data output from sample rate converters 50I, 50Q is divided down from the ultimate transmit frequency $F_{tx}$. In this example, the sampling frequency $F_s$ at band-pass sigma-delta modulator 40 is four times the transmit frequency $F_{tx}$ ($F_s=4\ F_{tx}$), and the sample rate at the outputs of SRC 50I, 50Q is $F_s/160$, in this example. A clock signal at this output rate of $F_s/160$ is provided to SRCs 50I, 50Q by clock distribution circuitry 32.

Gain stages 52I, 52Q apply a selected gain value to each of the sample rate converted signals from SRCs 50I, 50Q, respectively. Preferably, the value of gain applied by gain stages 52I, 52Q is a binary value, having relatively close resolution (e.g., on the order of 0.25 dB steps). Preferably, gain stages 52I, 52Q are implemented by way of digital multipliers, which may be accomplished by binary shifters as known in the art, to achieve both accuracy and efficient performance. The sample rate at the output of gain stages 52I, 52Q in this embodiment of the invention remains at $F_s/160$.

Following the application of the desired gain value, each of the in-phase and quadrature-phase components are applied to a corresponding function 54I, 54Q that applies a cascaded-integrate-and-comb (CIC) filter and a digital finite impulse response (FIR) filter. The filtering of the data by CIC and FIR functions 54I, 54Q will depend upon the desired spectral properties. The interpolation of the data components applied by CIC and FIR functions 54I, 54Q serve to increase the sample rate. In this example, the output sample rate from CIC and FIR functions 54I, 54Q is at a rate of $F_s/4$. Upconverting of this datastream by digital upconverter functions 36I, 36Q will place the datastream at the proper sample rate for modulation, as will now be described.

As shown in FIG. 4, digital upconverter function 36I upconverts the in-phase filtered and interpolated datastream, and digital upconverter function 36Q upconverts the quadrature-phase filtered and interpolated datastream. The upconverting applied by each of digital upconverter functions 36 effectively multiplies each sample of the datastream by a series of values corresponding to a cosine function (for in-phase digital upconverter function 36I) and a sine function (for quadrature-phase digital upconverter function 36Q). As a result, the outputs of upconverter functions 36I, 36Q correspond to orthogonal components, each having an amplitude corresponding to one of their sample values.

Figure 5:
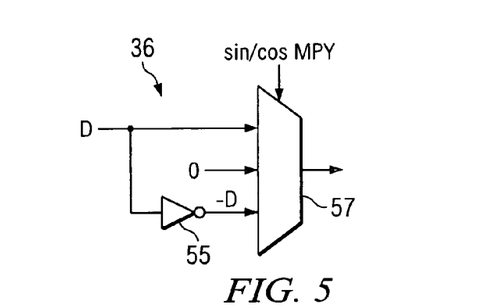
FIG. 5 is an electrical diagram, in block form, of an upconverter mixer in the digital upconverter of FIG. 4 according to the preferred embodiments of the invention.

According to this embodiment of the invention, digital upconverter functions 36I, 36Q may be realized by simple multiplexer circuits, as will now be described relative to FIG. 5. Incoming data words D from corresponding CIC & FIR function 54 are applied to one input of multiplexer 57, and via multiple-bit inverter function 55 to a second input of multiplexer 57 (as the value −D). A third input of multiplexer 57 receives a zero data value (a "0" binary level for each of a number of bits corresponding to the expected data word D). Control inputs are applied to multiplexer 57 on lines sin/cos MPY by control circuitry (not shown), or from clock distribution circuitry 32, to cause multiplexer 57 to select among its inputs for application to its output.

The control inputs applied to multiplexer 57 sequence among its inputs in a pattern corresponding to a sine or cosine waveform, at a frequency that is four times that of the value of data words D applied to multiplexer 57. For the example of digital upconverter function 36I, the output data signal corresponds to the value of data word D times a cosine function; for the example of digital upconverter function 36Q, the output data signal corresponds to the value of data word D times a sine function. The pattern to be applied may be derived by considering that the sample rate at the output of multiplexer 57 is to be at sampling frequency $F_s$, while the input data rate is at ¼ this frequency $F_s$; as a result, the output of multiplexer 57 generates four samples from each input sample. The desired output of multiplexer 57 for the example of digital upconverter function 36I is:

$$D\cos(2\pi ft) = D\cos\left(2\pi\left(\frac{1}{T_s}\right)t\right) \tag{1a}$$

and from digital upconverter function 36Q is:

$$D\sin(2\pi ft) = D\sin\left(2\pi\left(\frac{1}{T_s}\right)t\right) \tag{1b}$$

where the output frequency (from multiplexer 57) is $F_s$, which has a sample period of $1/T_s$. Because four samples are taken within each period of the output frequency (i.e., the input frequency is $F_s/4$), the time variable t will have the values of $t_1=0$, $t_2={}^T\!s/4$, $t_3={}^{2T}\!{}_Ts/4$, and $t_4={}^{3T}\!{}_{s=1}/4$ within each period $T_s$. For example, the sequence of output values from multiplexer 57 within digital upconverter function 36Q in applying the sine waveform, can be realized by:

$$D\sin\left(2\pi\left(\frac{1}{T_s}\right)t_1\right) = D\sin\left(2\pi\left(\frac{1}{T_s}\right)\cdot 0\right) = D\sin(0) = 0 \tag{2a}$$

$$D\sin\left(2\pi\left(\frac{1}{T_s}\right)t_2\right) = D\sin\left(2\pi\left(\frac{1}{T_s}\right)\frac{T_s}{4}\right) = D\sin\left(\frac{\pi}{2}\right) = D \tag{2b}$$

$$D\sin\left(2\pi\left(\frac{1}{T_s}\right)t_3\right) = D\sin\left(2\pi\left(\frac{1}{T_s}\right)\frac{2T_s}{4}\right) = D\sin(\pi) = 0 \tag{2c}$$

$$D\sin\left(2\pi\left(\frac{1}{T_s}\right)t_4\right) = D\sin\left(2\pi\left(\frac{1}{T_s}\right)\frac{3T_s}{4}\right) = D\sin\left(\frac{3\pi}{2}\right) = -D \tag{2d}$$

The sin/cos MPY control inputs to multiplexer 57 in quadrature-phase digital upconverter function 36Q thus selects among its inputs in this pattern (0, D, 0, −D) within each cycle of the sampling dock. Similarly, the sin/cos MY control inputs to multiplexer 57 in in-phase digital upconverter function 36I selects among its inputs in a pattern (D, 0, −D, 0) within each cycle of the sampling dock; of course, the value of data input word D applied to in-phase digital upconverter function 36I will differ from that applied to quadrature-phase digital upconverter function 36Q because of the operation of serial-to-parallel converter 46 in splitting the incoming bitstream into components.

Referring back to FIG. 4, the outputs of in-phase digital upconverter function 36I and quadrature-phase digital upconverter function 36Q are applied to adder 38, which combines the incoming data values into a single data stream at a sample frequency of $F_s$. As evident from the description of the operation of digital upconverter functions 36, the output of in-phase digital upconverter function 36I is orthogonal to the output of quadrature-phase digital upconverter function 36Q, in that in-phase digital upconverter function 36I and quadrature-phase digital upconverter function 36Q do not simultaneously present non-zero values. Accordingly, adder 38 may be a digital adder, or alternatively may be a multiplexer with a select input signal that is synchronized with in-phase digital upconverter function 36I and quadrature-phase digital upconverter function 36Q. The combined signal generated by adder 38 is then presented to digital band-pass sigma-delta modulator 40, for modulation into an RF output signal.

Band-pass sigma delta modulator 40, according to this preferred embodiment of the invention, converts the relatively wide input data (e.g., fourteen bits per sample) into a fewer number of bits per sample, having a frequency spectrum that is centered at the desired transmit frequency $F_{tx}$, which in this case is one-fourth the sample frequency $F_s$. Also according to this preferred embodiment of the invention, band-pass sigma delta modulator 40 is constructed to have notches, or "zeros", on either side of the desired transmit frequency $F_{tx}$, with at least one of the notches corresponding to the center of the receive band. This operation of band-pass sigma-delta modulator 40 results in excellent receive band noise margin, which permits the relaxing of downstream filters in the transmit data path, as mentioned above.

Figure 6:
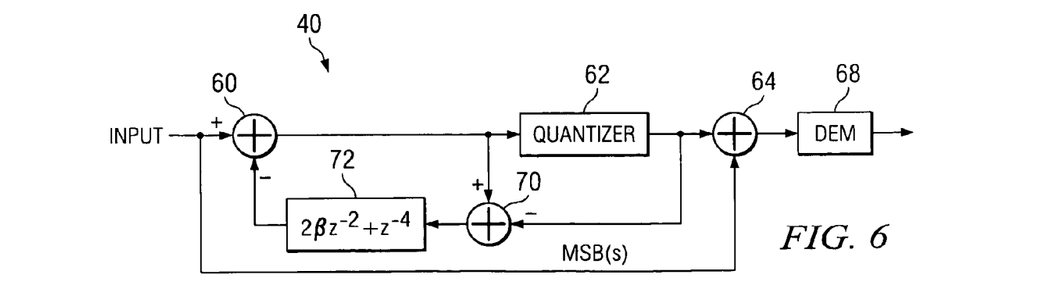
FIG. 6 is an electrical diagram, in block form, of a digital band-pass sigma-delta modulator in the transmitter of FIG. 3 according to the preferred embodiments of the invention.

Referring now to FIG. 6, the construction of band-pass sigma-delta modulator 40 according to this first preferred embodiment of the invention will now be described in detail. As evident from this description, band-pass sigma-delta modulator 40 effectively corresponds to digital signal processing operations, and as such may be realized by way of a program sequence executed by a digital signal processor (DSP), or alternatively by way of custom logic hardware for this function. FIG. 6 thus illustrates the construction of band-pass sigma-delta modulator 40 by way of a data flow diagram.

One or more of the most significant bits of the input data word from adder 38 is applied to one input of downstream adder 64, and the remaining least significant bits are applied to one input of adder 60. The other input of adder 60, which is a negative input, receives a feedback signal as will be described below. As such, the function of adder 60 is to subtract the digital value of the feedback signal from the input digital value; the result is forwarded to quantizer 62 and to one input of adder 70. Quantizer 62 extracts the most significant bits from the result of adder 60, for example the most significant two or three bits, and forwards this value to one input of downstream adder 64 and to a second input of adder 70. Adder 70 subtracts the result from quantizer 62 from the full value presented to quantizer 62 by adder 60, to generate a difference value (i.e., a remainder) that is applied to digital filter 72. Downstream adder 64, on the other hand, adds the most significant bit or bits of the input value to the quantized value from quantizer 62, preferably maintaining the sum as a two or three bit value, and applies this result to dynamic element matching function 66 for mismatch reduction in the conventional manner, and then for output to FIR function 42 (FIG. 3).

Digital filter 72, according to this embodiment of the invention, determines the frequency response of band-pass sigma-delta modulator 40, particularly in establishing the zeroes, or notches, in the band-pass characteristic. According to this first preferred embodiment of the invention, the zeroes in the characteristic are selected to align with the receive band according to the operative standard. For the case of CDMA2000, in which an example of the transmit frequency $F_{tx}$ is 836 MHz, the receive band is centered at 881 MHz, which is 45 MHz above transmit frequency $F_{tx}$. A symmetrical placement of the zeros of this band-pass characteristic can be implemented by digital filter 72 using a noise transfer function (NTF) of:

$$NTF=1+2\beta z^{-2}+z^{-4} \quad (3)$$

where $\beta$ is defined as:

$$\beta = 2\cos\left(2\pi\frac{f_c}{f_s}\right)^2 - 1 \quad (4)$$

where $f_c$ is the offset of the zero from the center frequency $f_s$ (which is the transmit frequency $F_{tx}$. In this example, the offset frequency $f_c$ is 45 MHz.

Figure 7A:
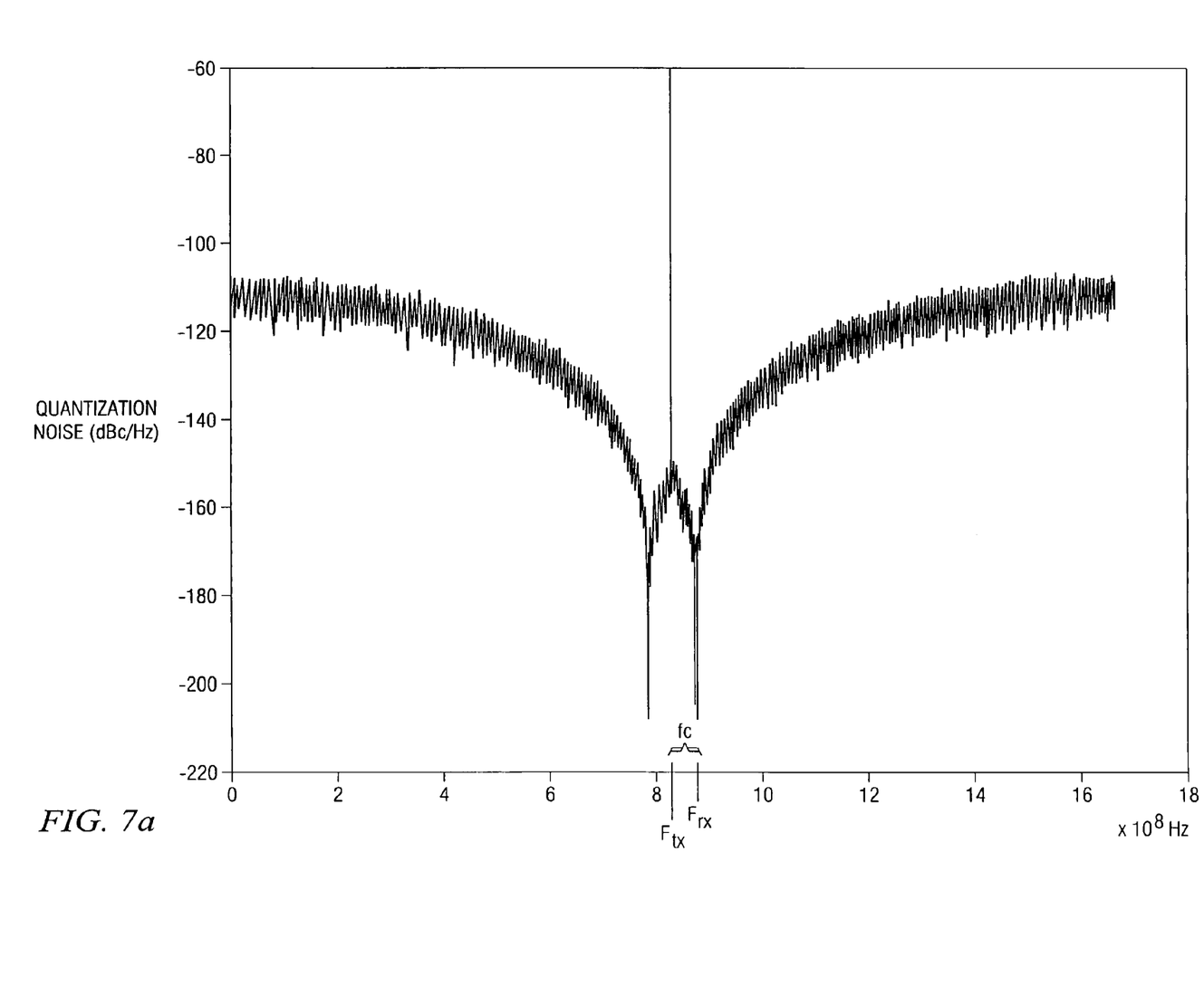
FIGS. 7a and 7b are plots of quantization noise over frequency illustrating the performance of an example of the operation of the digital band-pass sigma-delta modulator of FIG. 6 according to the first preferred embodiment of the invention.
Figure 7B:
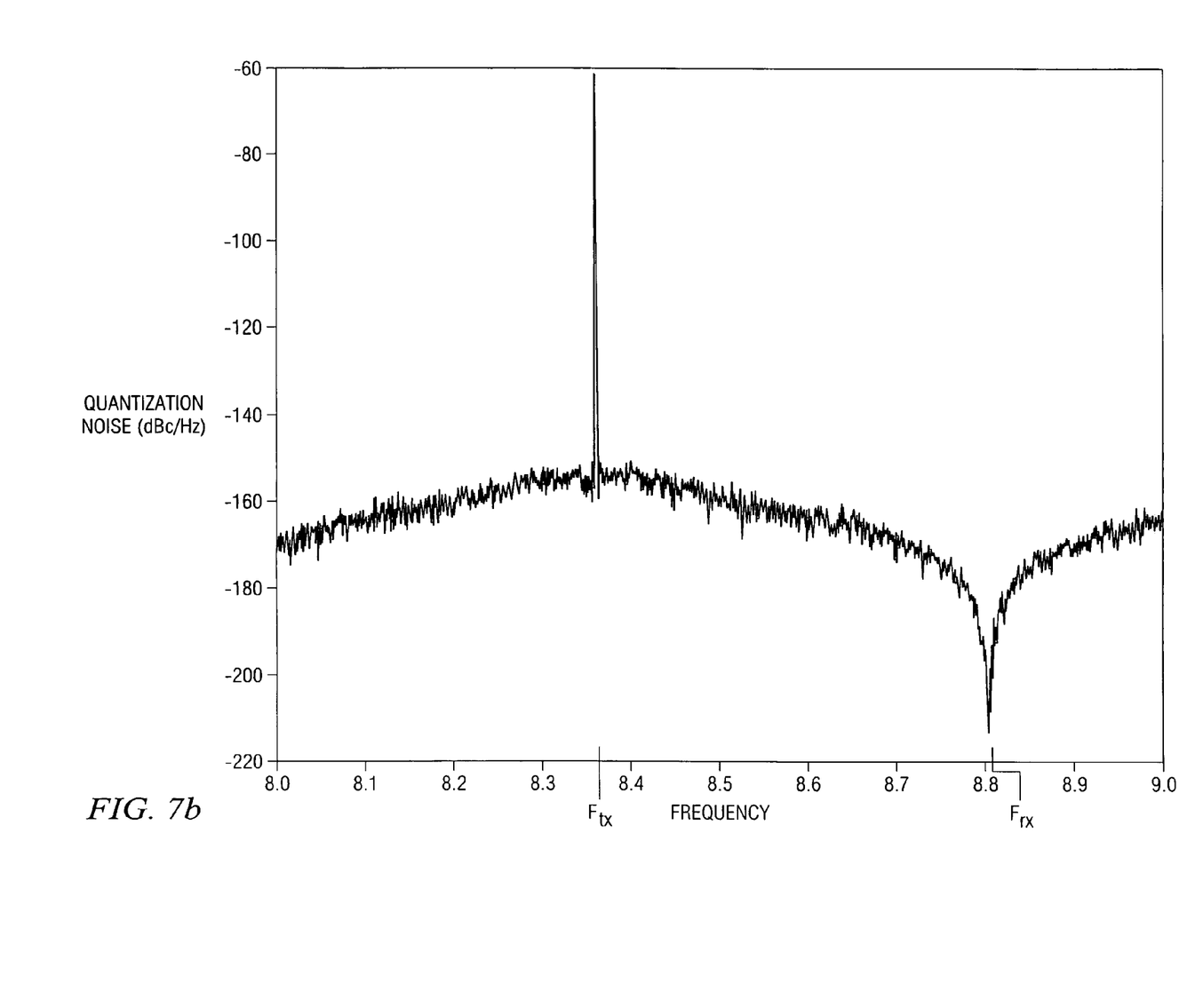

FIGS. 7a and 7b illustrate the performance of this example of the first preferred embodiment of the invention, in which offset frequency $f_c$ is 45 MHz and center frequency $f_s$ is the transmit frequency $F_{tx}$=836 MHz. In this example, offset frequency $f_c$ is selected to correspond to the receive center frequency $F_{rx}$ of 881 MHz. As evident from the simulation results of FIG. 7a, zeroes are present in the characteristic of quantization noise, and are evenly spaced from the pole frequency $F_{tx}$=836 MHz by offset frequency $f_c$ on either side, of 45 MHz. FIG. 7b is a magnified view of the portion of the characteristic of FIG. 7a, on the high side of transmit frequency $F_{tx}$=836 MHz, illustrating the sharp zero at receive center $F_{rx}$=881 MHz, as desired.

It is also contemplated, according to the preferred embodiments of the invention, that more complex noise transfer functions can be used to achieve additional control over the characteristic of digital band-pass sigma-delta modulator 40. In some applications, it may be desirable to have asymmetric zeros in the characteristic, for example in wireless telephone handsets that have a receive band on one side of the transmit frequency $F_{tx}$ and a frequency band on the other side of transmit frequency $F_{tx}$ for another service, such as the GPS band or the like. An exemplary NTF for digital filter 72 in digital band-pass sigma-delta modulator 40 for defining asymmetric offset frequencies $f_{c1}$ and $f_{c2}$ (on the low side and high side, respectively, of transmit frequency $$NTF=z^{-4}+2(\sin f_{c1}+\sin f_{c2})z^{-3}+2(1+2\sin f_{c1}\sin f_{c2})z^{-2}+2(\sin f_{c1}+\sin f_{c2})z^{-1}+1 \quad (5)$$

It is contemplated that those skilled in the art having reference to this specification will be readily able to derive alternative noise transfer functions, including even more complex functions, as desired for their specific applications. Of course, additional complexity in digital filter 72 may involve additional cost in efficiency and circuit complexity, which should be considered by the designer.

Figure 8:
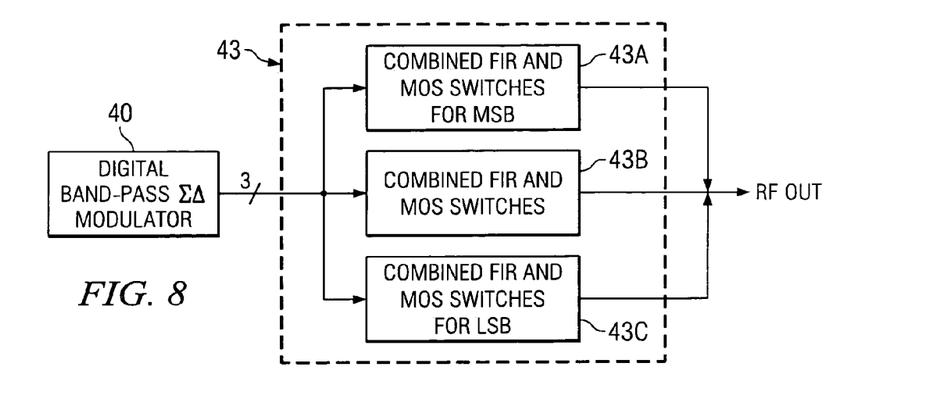
FIG. 8 is an electrical diagram, in block form, of the combined FIR and MOS power switch functionality in the digital transmitter of FIG. 3 according to the preferred embodiments of the invention.

As mentioned above relative to FIG. 3, FIR function 42 and MOS switches 44 are preferably combined into array 43, for the generation of an RF output signal with coarse gain control. FIG. 8 illustrates the arrangement of array 43 according to this preferred embodiment of the invention. As shown in FIG. 8, digital band-pass sigma-delta modulator 40 outputs a multiple-bit digital output, which is three bits wide in this example, to array 43. According to this embodiment of the invention, each bit of the multiple-bit modulated output is separately applied to an FIR filter and drives separate MOS RF power switches, by separate combined sub-arrays 43A through 43C. Of course, the number of sub-arrays 43j will depend upon the number j of output bits from digital band-pass sigma-delta modulator 40. The outputs of the three sub-arrays 43A, 43C drive output line RF OUT, which is applied to downstream SAW filter 22 (FIG. 2).

Figure 9:
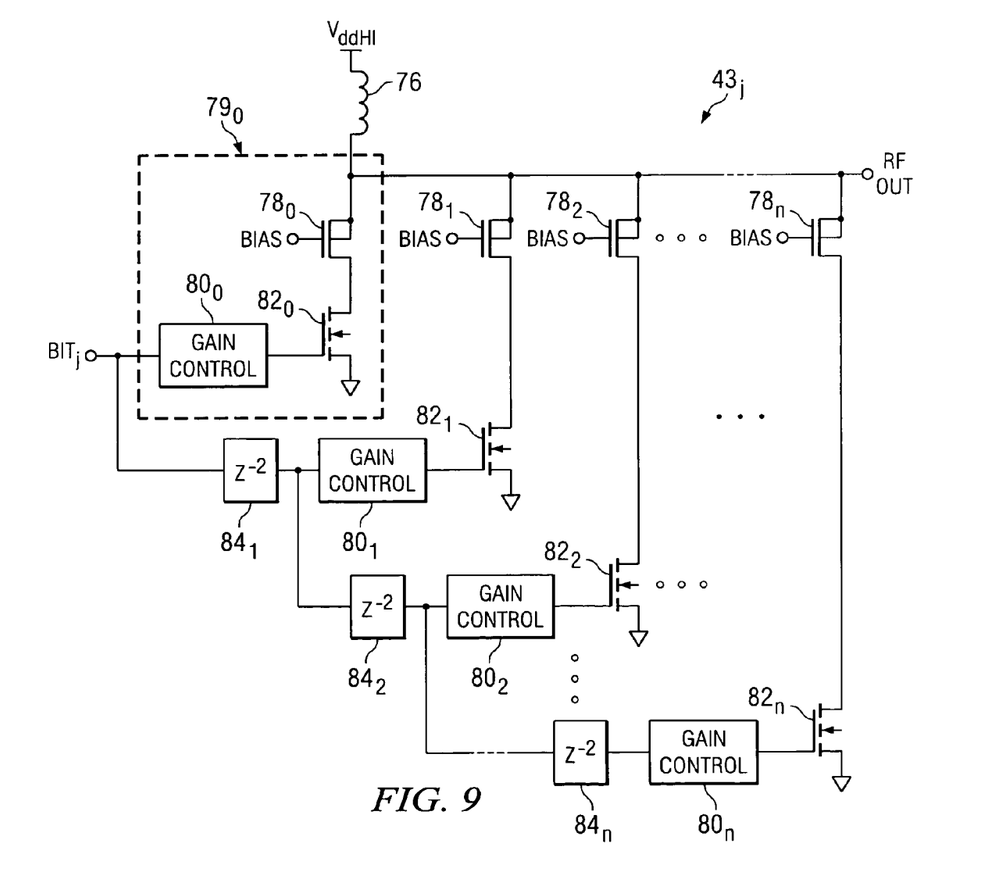
FIG. 9 is an electrical diagram, in schematic form, illustrating further detail in the construction of the combined FIR and MOS power switch functionality in the digital transmitter of FIG. 3 according to the preferred embodiments of the invention.

Referring now to FIG. 9, the construction of an exemplary sub-array 43j will now be described. It is contemplated that each of sub-arrays 43A through 43C will be similarly constructed as the example of FIG. 9. Sub-array 43j receives one input bit $BIT_j$ from digital band-pass sigma-delta modulator 40, and generates an RF signal on line RF OUT in response to that bit, after effecting FIR digital filtering and after applying a gain value.

The output drive circuit of FIG. 9 includes inductive load 76 that is connected between power supply voltage $V_{ddHI}$ and output line RF OUT. Drain-extended MOS (DEMOS) transistors $78_0$ through $78_n$, one for each tap of the FIR filter as will be described in detail below, each has its drain connected to output line RF OUT and its gate biased by a reference voltage BIAS according to the desired conduction therethrough. Each DEMOS transistor 78 is connected, in cascode fashion, with a short-channel n-channel MOS transistor 82, with the drain of transistor 82 connected to the source of its associated DEMOS transistor 78, and the source of transistor 82 connected to ground. The gate of each transistor 82 is controlled in response to the input bit $BIT_j$ for a tap of the FIR filter, and after application of a gain value by an associated gain control block 80.

FIG. 9 illustrates a single DEMOS transistor 78 and a single short-channel MOS transistor 82 for each tap of the FIR filter. As will become apparent from the description of gain control block 80 below, each cascode pair of DEMOS transistor 78 and MOS transistor 82 preferably corresponds to multiple cascode pairs connected in parallel, where the gate of each MOS transistor 82 is separately controlled by gain control block 80. This construction will be described in further detail below, considering the cascode pairs of DEMOS transistor 78 and MOS transistor 82 and its associated gain control block 80, for a given tap, as functional block 79. To more clearly explain the advantages of the preferred embodiments of the invention, however, the higher-level illustration of FIG. 9 illustrates only a single cascode pair for each FIR tap.

As known in the art, drain-extended MOS (DEMOS) transistors include a somewhat lightly-doped drift region as part of the drain of the transistor, disposed between the channel region and the more highly-doped drain contact. The drift region may underlie the gate electrode and gate dielectric, or in some cases may also underlie a field dielectric structure. This drift region, or "drain extension", raises the reverse breakdown voltage of the device. As a result, DEMOS devices are capable of reliable operation at much higher drain-to-source voltages than devices constructed according to the same geometry but without the drain extension. DEMOS transistors have become especially important as MOS and CMOS devices have been scaled down to extremely small geometries in recent years.

The cascode connection of DEMOS transistors 78 with associated short-channel MOS transistors 82 provides important advantages in the driving of an output RF signal, and enables the combining of FIR filter function 42 and MOS switches 44 into the same integrated circuit as one another, and with other digital functions of digital transmitter 20 described above. The power supply voltage $V_{ddHI}$ can be significantly higher than the power supply voltage for the high-speed core logic of the device, as is typical for RF output from power MOS devices. To the extent that this high voltage appears at output line RF OUT, most of this voltage drop can be across DEMOS transistor 78 (rather than across its associated short-channel transistor 80), assuming proper selection of bias voltage BIAS). As noted above, the breakdown voltage of DEMOS transistor 78 is much higher than that of short-channel transistor 80, and as such can withstand this voltage drop, and provide the high RF power required. Each DEMOS transistor 78 thus shields its associated short-channel transistor 82 from high output voltages at output line RF OUT.

On the other hand, DEMOS transistor 78 is not well-suited for fast switching, especially at the switching times required for RF communication. This is especially true according to this embodiment of the invention, in which digital band-pass sigma-delta modulator 40 is operates at an oversampled sample frequency $F_s$ that, in this example, is four times the transmit frequency $F_{tx}$. However, short-channel MOS transistors 82 can rapidly switch at these frequencies. As such, MOS transistors 82 effect the switching of each cascode driver in sub-array 43j, in response to input bit $BIT_j$ and the FIR filter.

Additional advantages are also provided by this cascode arrangement. As mentioned above, MOS transistors 82 operate at high switching rates. Spurious digital behavior from this fast switching is shielded from appearing at output line RF OUT by DEMOS devices 78. In addition, the biasing of DEMOS devices 78 by reference voltage BIAS provides a stable bias point for the operation of MOS transistors 82, further ensuring excellent switching performance for MOS transistors 82.

As evident from FIG. 9, multiple cascode transistor pairs 78, 82 are provided in sub-array 43j. According to the preferred embodiments of this invention, each cascode pair corresponds to a tap of a finite impulse response (FIR) filter, effecting FIR filter function 42 (FIG. 3). As discussed above, digital transmitter 20 operates within a transmit frequency band, and preferably avoids other frequency bands (such as the receive band, and frequency bands for other services such as GPS, Bluetooth communications, and the like). Accordingly, FIR filter 42 is preferably a band-pass FIR filter, with notches or zeroes in the characteristic that preferably align with the frequencies of the other bands with which interference from digital transmitter 20 is to be minimized. As known in the art, such band-pass FIR filters are typically digitally realized by second-order delays between each tap. An example of a seven-tap FIR band-pass FIR filter transform function H(z) suitable for use in connection with the preferred embodiments of the invention is:

$$H(z)=1-z^{-2}+z^{-4}-z^{-6}+z^{-8}-z^{-10}+z^{-12} \qquad (6)$$

Of course, other filter characteristics may alternatively be implemented. This particular characteristic is advantageous because the coefficients are all unity, eliminating the need for additional gain stages or the complexity of incorporating different gain factors for each tap in gain control blocks 80.

Care should also be taken to consider the effect that the notches in the FIR filter characteristic can shift as different "channels" within the transmit band are selected. For example, in the cellular band, the different channels that can be selected can vary by as much as ±50 MHz (in sampling frequency $F_s$); this maximum difference in channel transmit frequency can result in a shift of the notches in the FIR characteristic of equation (6) of about 23 MHz in the GPS band. It is contemplated that those skilled in the art having reference to this specification will be readily able to select the appropriate FIR filter characteristic for each particular application.

As shown in FIG. 9, the FIR filter is incorporated by the cascading of delay stages $84_1$ through $84_n$. In this embodiment of the invention, since the delay stages are implemented in pairs (i.e., in transform function H(z), all powers of z are multiples of two), each delay stage 84 inserts a delay of two sample periods (i.e., a term of $z^{-2}$). In this example, where the current state of input bit $BIT_j$ is at sample time t, the output of first delay stage $84_1$ corresponds to input bit $BIT_j(t-2)$, from two samples earlier. The output of first delay stage $84_1$ is applied to the input of corresponding gain control block $80_1$. In addition, the output of first delay stage $84_1$ is also applied to the input of delay stage $84_2$, so that the output of delay stage $84_2$ is $BIT_j(t-4)$, or four samples prior to the current input bit $BIT_j(t)$. Similarly, the output of delay stage $84_2$ is applied to the input of its corresponding gain control block $80_2$ and, in sequence, to the input of a next delay stage, and so on. The output of last delay stage $84_n$, which is applied to the input of gain control block 80, is thus $BIT_j(t-2n)$. The particular coefficients of the FIR transfer characteristic can be realized within gain control blocks 80; alternatively, especially for a transfer characteristic involving only unity coefficients, inverters can be inserted within, or in series with, gain control blocks 80 as appropriate for the filter.

Figure 10:
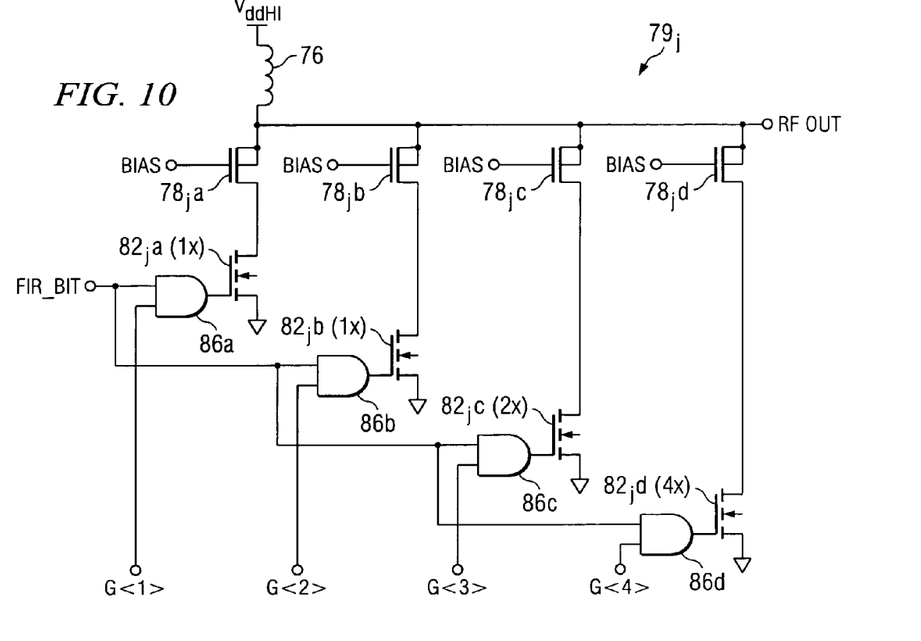
FIG. 10 is an electrical diagram, in schematic form, illustrating still further detail in the construction of the combined FIR and MOS power switch functionality in the digital transmitter of FIG. 3 according to the preferred embodiments of the invention.

Referring now to FIG. 10, the construction of an exemplary gain control block $80_j$ according to the preferred embodiments of the invention will now be described, as part of an exemplary functional block $79_j$ of FIG. 9. As mentioned above, gain control blocks 80 effect coarse gain control on the signal to be output on line RF OUT. In these embodiments of the invention, it is contemplated that a digital gain control word generated by controller 41 (FIG. 3), or alternatively another digital function within digital transmitter 20 or the system embodying transmitter 20, will generate the appropriate control word. This gain control can be a pre-programmed value, or alternatively may be a calculated value based on the particular communications channel conditions currently being encountered.

In the exemplary embodiment of gain control block $80_j$ illustrated in FIG. 10, gain in the range of 18 dB can be applied, in 6 dB steps. In this implementation, four DEMOS transistors $78_ja$ through $78_jd$ (together corresponding to one of DEMOS transistors 78 of FIG. 9) are provided, each having its drain connected to line RF OUT and its gate biased by reference voltage BIAS. Accordingly, in this example, four short-channel n-channel MOS transistors $82_ja$ through $82_jd$ (together corresponding to one of MOS transistors 82 of FIG. 9) are provided, each having its drain connected to a corresponding one of DEMOS transistors $78_ja$ through $78_jd$ and its source at ground. According to this embodiment of the invention, MOS transistors $82_ja$ through $82_jd$ have different drive capacities (e.g., different channel widths for given common channel length), with this differing drive preferably binary-weighted. In this example, largest MOS transistor $82_jd$ has four times the drive capability of one of the two smallest MOS transistors $82_ja$, $82_jb$. MOS transistor $82_jc$ has twice the drive capability of the smallest MOS transistor $82_ja$ (or $82_jb$).

The gates of each of MOS transistors $82_ja$ through $82_jd$ are driven by the output of a corresponding one of AND gates 86a through 86d. Each AND gate 86a through 86d receives input bit FIR_BIT to control block $80_j$ at one input. In the case of control block $80_0$, input bit FIR_BIT corresponds to input bit $BIT_j$ from band-pass sigma-delta modulator 40; in the case of control blocks $80_1$ through $80_n$, input bit FIR_BIT corresponds to the output of the associated delay stage $84_1$ through $84_n$, as the case may be. The other input of each of AND gates 86a through 86d, in this example, receives one bit of gain control word G. In this example, in which AND gate 86d drives the largest MOS transistor $82_jd$, AND gate 86d receives most significant gain control bit G<4>. AND gate 86c receives the next most significant gain control bit G<3>, and AND gates 86a, 86b receive least significant gain control bits G<1>, G<2> (which have equal weight), respectively. In this way, gain control word G determines which of MOS transistors $82_ja$ through $82_jd$ are enabled, as a "0" level on any one of the bits of gain control word G will disable its associated one of MOS transistors $82_ja$ through $82_jd$.

According to this preferred embodiment of the invention, the value of the gain applied by gain control block $80_j$ corresponds to the amount of drive provided by MOS transistors $82_ja$ through $82_jd$ for a "1" level of input bit FIR_BIT. If either of MOS transistors $82_ja$ or $82_jb$ is enabled, minimum gain (0 dB) results. If MOS transistor $82_jc$ is enabled, twice the drive of transistor $82_ja$ (or $82_jb$) is available, providing a gain of +6 dB. If MOS transistor $82_jd$ is enabled, four times the drive of transistor $82_j$ is available, providing a gain of +12 dB, and so on. Of course, a zero gain state (none of MOS transistors $82_ja$ through $82_jd$ enabled) is not permitted. In this example, the output gain associated with the available values of control word G is:

| Gain control word G | Output gain (dB) |
| --- | --- |
| 0001 or 0010 | 0 dB |
| 0100 | 6 dB |
| 1000 | 12 dB |
| 1111 | 18 dB |

Of course, other combinations of bits of gain control word G can be used to achieve various gain levels. For example, a gain control word of 0111 will enable MOS transistors $82_ja$ through $82_jc$, providing four times the gain of single MOS transistor $82_ja$, and thus a gain of +12 dB.

It has been observed, in connection with this invention, that even slight mismatch among the various transistors in gain control block 80, and also MOS transistors 82 and DEMOS transistors 78, can provide substantial gain error. This is believed to be especially true at low gain levels (e.g., 0 dB gain). According to the preferred embodiments of the invention, therefore, controller 41 preferably dithers, or rotates, among equivalent values of the gain control word so that the effects of device mismatch are minimized. For example, in the 0 dB gain state, it is preferred that the gain control word G alternate in value between 0001 and 0010, for example at a rate of $F_s/2$, to reduce the effects of device mismatch. Similar dithering or rotating may also be applied between other gain control word equivalent values (1000 and 0111, for example). Using this technique, the sensitivity of digital transmitter 20 to device mismatch is greatly relaxed. For example, maximum gain error of 0.25 dB can be attained with device mismatch as much as 6%.

Referring back to FIGS. 8 and 9, the output of each of sub-arrays 43A through 43C thus combine, in this fashion to produce an output signal on line RF OUT at a sample rate of $F_s$, which is four times the transmit rate $F_{tx}$. As shown in FIG. 2, this output on line RF OUT is then ready to be applied to SAW filter 22, for eventual application to power amplifiers 24 for transmission over antenna A.

According to this embodiment of the invention, as evident from the foregoing description, substantial advantages are provided. This invention enables the full digital realization of digital transmitter 20, including the integration of MOS power switches. This eliminates much of the analog circuitry, and indeed much of the circuitry that was previously required to be implemented as bipolar or BiCMOS devices. This enables the RF digital transmitter to be implemented in CMOS technology, and to scale along with the scaling of digital baseband circuitry. Much more of the circuitry involved in modern communications devices, such as wireless telephone handsets, will now be able to take advantage of continuing advances in CMOS manufacturing technology.

Further, according to this first preferred embodiment of the invention, the frequency characteristics of the transmitter can be digitally designed to further minimize noise generated in the receive band, and in other bands that the system may be required to use. For example, it has been observed through simulation that the digital realization of this transmitter, according to this first preferred embodiment of the invention, has reduced noise in the receive band to as low as −190 dBc/Hz, which is well below current targets for receive band noise. In addition, the digital realization of the band-pass operation of this digital transmitter enables adjustment of the notches in the band-pass characteristics, providing great flexibility in the operation of the transmitter.

Further, gain control is implemented in the digital transmitter according to this preferred embodiment of the invention in a manner that eliminates the need for calibration of analog AGC functions, as is required in conventional transmitter systems. This greatly improves the manufacturing and implementation efficiency of the transmitter system, as well as improving its gain accuracy.

Figure 11:
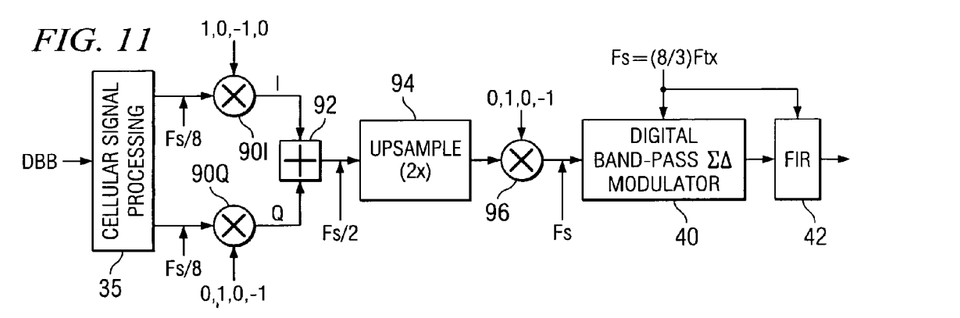
FIG. 11 is an electrical diagram, in block form, illustrating the architecture of digital upconverter and signal processing functions in the transmitter of FIG. 3 according to a second preferred embodiment of the invention.

Referring now to FIG. 11, the digital upconverter circuitry of a digital transmitter according to a second preferred embodiment of the invention will now be described. This digital upconverter circuitry enables the use of the digital transmitter architecture of this invention in a so-called "high band" application, such as the digital PCS band, WCDMA band, and EDGE high-band, in which the transmit frequency $F_{tx}$ is about 1.8 GHz or higher. If the circuitry according to the first preferred embodiment of the invention were to be used for such a high-band implementation, it is feared that the power dissipation could be excessive, perhaps beyond the capability of current-day CMOS technology.

According to this second preferred embodiment of this invention, this high band operation is attained by using a slightly higher sampling frequency $F_s=(8/3)F_{tx}$ and by incorporating two stages of digital up-conversion. As shown in FIG. 11, cellular signal processing function 35 is provided as before, and as such includes serial-to-parallel conversion, application of a digital pulse shaping filter, application of a digital gain, additional filtering (CIC, FIR, etc.), and sample rate conversion. In this example, the sample rate conversion applied by cellular signal processing function 35 converts the incoming digital baseband signal DBB to parallel in-phase and quadrature-phase components at a sample rate of $F_s/8$, or $F_{tx}/3$.

According to this second preferred embodiment of the invention, the in-phase and quadrature-phase components are each digitally upconverted by mixers 90I, 90Q, respectively. Mixer 90I applies a cosine waveform (i.e., digital values 1, 0, −1, 0) at a frequency $F_s/2$, which is four times that of the incoming frequency $F_s/8$. Similarly, mixer 90Q applies a sine waveform (i.e., digital values 0, 1, 0, −1) to the quadrature-phase component. As described above relative to the first preferred embodiment of the invention, each sample at the input of the mixer thus receives a full cycle of the mixing cosine or sine wave, as the case may be. The resulting orthogonal components are added at adder 92, resulting in a series of samples at a frequency of $F_s/2$.

Upconverter function 94 upconverts the output of adder 92, for example by simply repeating each sample value. The upconverted output is then applied to mixer 96, which mixes another sinusoid (in this case a sine waveform; 0, 1, 0, −1) also at a frequency of $F_s/2$. The resulting output from mixer 96 is thus at sampling frequency $F_s$, and is applied to digital band-pass sigma-delta modulator 40 for modulation, also at this sampling frequency $F_s=(8/3)F_{tx}$. FIR filter function 42 also operates at this frequency, as described above. To the extent that difference frequency components (i.e., generated at mixers 90, 96) are present, these difference frequency components will be removed by the operation of band-pass sigma-delta modulator 40.

Of course, the noise transfer function NTF utilized by band-pass sigma-delta modulator 40 according to this preferred embodiment of the invention will be different from that described above for the lower band case. In addition, it is contemplated that the filter transfer function H(z) applied by FIR function 42 will also be modified from that previously described. However, it is contemplated that those skilled in the art having reference to this description will be readily able to derive the appropriate transfer functions.

According to this second preferred embodiment of the invention, therefore, even high band digital cellular transmission can be handled by a digital transmitter operating at still-reasonable frequencies ($F_s$ of on the order of 5 GHz). The benefits of this invention can therefore be attained even for high band operation, and by circuitry that can be readily realized by current-day CMOS technology, and that can therefore take advantage of the scalability of this technology.

Figure 12:
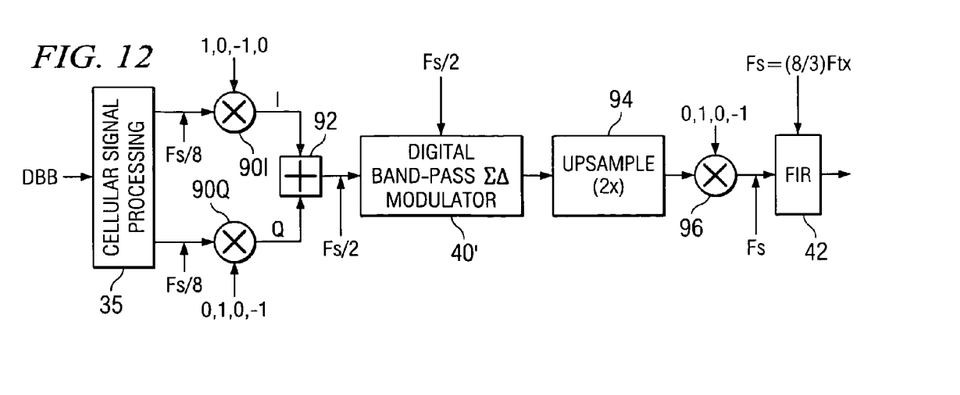
FIG. 12 is an electrical diagram, in block form, illustrating the architecture of digital upconverter and signal processing functions in the transmitter of FIG. 3 according to a third preferred embodiment of the invention.

FIG. 12 illustrates a third preferred embodiment of the invention, also directed to the digital transmission of high band (WCDMA, PCS, etc.) communications. The same reference numerals are used in FIG. 12 to refer to the same elements as present in the embodiment of the invention in FIG. 11. The approach of FIG. 12 differs from that of FIG. 11 according to the second preferred embodiment of the invention, in that the sigma-delta modulation is carried out at a lower frequency.

According to this third preferred embodiment of the invention, band-pass sigma-delta modulator 40' is operated at a lower frequency, namely $F_s/2$, on the combined output from adder 92. The operation of band-pass sigma-delta modulator 40' is the same as described above, except that it is likely that the noise transfer function (NTF) will be modified from that described above. The output of band-pass sigma-delta modulator 40' is then upconverted by upconverter function 94, and then applied to mixer 96 to bring the signal up to a frequency $F_s$. At this point, FIR function 42, operating at frequency $F_s$ then applies the appropriate FIR transfer function and drives MOS switches 44 in the manner described above.

Accordingly, these second and third preferred embodiments of the invention illustrate that the important benefits of the invention, particularly in enabling the fully digital implementation of an RF transmitter, in a manner that renders the circuitry capable of CMOS implementation, can be attained also for high band transmission operation. Furthermore, as noted above, the digital implementation according to all of these embodiments of the invention are contemplated to result in excellent noise band performance, which permits the relaxing of expensive components such as SAW filters and also relaxes the constraints on receive band circuitry and circuitry for other services.

According to this invention, therefore, it is contemplated that the ability to advantageously realize a digital transmitter in this manner will result in improved functionality in systems such as wireless telephone handsets, at lower cost and improved performance and fidelity. These and other advantages of this invention will be apparent to those skilled in the art having reference to this specification.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A digital transmitter circuit, comprising:
   signal processing circuitry for processing a digital baseband input signal;
   a first digital upconverter function, for upconverting the processed digital baseband input signal to an intermediate frequency;
   a digital band-pass sigma-delta modulator, for modulating the upconverted signal at a sample frequency at least as high as the intermediate frequency;
   a digital finite impulse response filter, for filtering the modulated upconverted signal; and
   an array of power switching devices, for generating an RF signal responsive to the filtered modulated upconverted signal.

2. The circuit of claim 1, wherein the first digital upconverter function upconverts an in-phase component of the processed digital baseband input signal;
   and further comprising:
   a second digital upconverter function, for upconverting a quadrature-phase component of the processed digital baseband input signal to an intermediate sampling frequency; and
   an adder for combining the upconverted in-phase and quadrature-phase components;
   and wherein the digital band-pass sigma-delta modulator modulates a signal corresponding to the combined upconverted in-phase and quadrature-phase components.

3. The circuit of claim 2, wherein the intermediate sampling frequency equals the sample frequency of the digital band-pass sigma-delta modulator.

4. The circuit of claim 3, wherein the digital finite impulse response filter filters the modulated upconverted signal at the sample frequency of the digital band-pass sigma-delta modulator.

5. The circuit of claim 2, wherein the intermediate sampling frequency is less than the sample frequency of the digital band-pass sigma-delta modulator;
   and further comprising:
   an upconverter function, for upconverting the combined upconverted in-phase and quadrature-phase components; and
   a mixer, having an output coupled to the digital band-pass sigma-delta modulator, for mixing the output of the upconverter function with a sinusoid to generate a signal at the sample frequency of the digital band-pass sigma-delta modulator.

6. The circuit of claim 2, wherein the digital band-pass sigma-delta modulator has an input coupled to the output of the adder;
   and further comprising:
   an upconverter function, for upconverting the modulated signal from the digital band-pass sigma-delta modulator; and
   a mixer, having an output coupled to the digital band-pass sigma-delta modulator, for mixing the output of the upconverter function with a sinusoid to generate a signal at a higher frequency than the sample frequency of the digital band-pass sigma-delta modulator.

7. The circuit of claim 1, wherein the first digital upconverter function comprises:
   a multiplexer, having a first input receiving the processed digital baseband input signal, having a second input receiving a logical complement of the processed digital baseband input signal, having a third input receiving a "0" digital value, and having a control input for receiving a sequence of select signals at the intermediate frequency, the sequence of select signals controlling the multiplexer to select among its inputs according to a sinusoidal pattern.

8. The circuit of claim 1, wherein the digital band-pass sigma-delta modulator comprises:
   a first adder, for generating a difference value between a digital input value and a feedback value;
   a quantizer, for quantizing the difference value from the first adder;
   a second adder, for adding the quantized difference value to the digital input value and producing a modulated output;
   a feedback adder, for generating a feedback difference between the difference value and the quantized difference value; and
   a digital filter function, for applying a noise transfer function to the feedback difference value to generate the feedback value.

9. The circuit of claim 8, wherein the sample frequency of the digital band-pass sigma-delta modulator corresponds to a multiple of a transmit frequency of the digital transmitter circuit;
   and wherein the noise transfer function has a selected band-pass characteristic centered at a frequency corresponding to the transmit frequency, and has at least one notch corresponding to a desired suppression frequency.

10. The circuit of claim 9, wherein the noise transfer function has first and second notches that are symmetrically spaced from the centered frequency.

11. The circuit of claim 9, wherein the noise transfer function has first and second notches that are asymmetrically spaced from the centered frequency.

12. The circuit of claim 1, wherein the digital finite impulse response filter and array of power switching devices are combined into a plurality of sub-arrays, each associated with one bit of the modulated upconverted signal.

13. The circuit of claim 12, wherein each of the plurality of sub-arrays comprises:
   a sequence of delay stages;
   a plurality of power transistors, each having a source-drain path connected on a first side to an output node, and having a gate electrode biased to a bias voltage; and a plurality of switching transistors, each associated with one of the plurality of power transistors, having a source-drain path connected between a second side of the source-drain path of its associated power transistor and a reference voltage, and having a gate electrode coupled to an output of a selected one of the sequence of delay stages.

14. The circuit of claim 13, wherein each of the plurality of sub-arrays further comprises:
a plurality of gain control blocks, each coupled between the output of a selected one of the sequence of delay stages and a gate electrode of an associated one of the plurality of switching transistors.

15. The circuit of claim 14, wherein the plurality of power transistors are arranged in groups, each group associated with one of the selected ones of the sequence of delay stages;
wherein the plurality of switching transistors are arranged in groups, each group associated with one of the selected ones of the sequence of delay stages, and each of the plurality of switching transistors in a group associated with one of the plurality of power transistors in its associated group.

16. The circuit of claim 15, wherein each of the gain control blocks is associated with one of the groups of the plurality of power transistors and its associated group of the plurality of switching transistors;
and wherein each gain control block comprises:
a plurality of logic functions, each for combining a bit of a gain control word with a logic state presented at the output of the selected one of the sequence of delay stages, and having an output coupled to the gate of one of the group of the plurality of switching transistors.

17. The circuit of claim 16, wherein each group of the plurality of switching transistors comprises switching transistors of different drive;
wherein one of the switching transistors in the group having a highest drive is associated with a most significant bit of the gain control word.

18. The circuit of claim 17, wherein multiple combinations within each group of the plurality of switching transistors provide equivalent drive;
and further comprising:
a controller for applying alternating values of the gain control word among the multiple combinations.

19. The circuit of claim 17, wherein first and second ones of the switching transistors within each group of the plurality of switching transistors correspond to the smallest drive;
and further comprising:
a controller for applying alternating values of the gain control word to select between the first and second ones of the switching transistors.

20. A digital band-pass sigma-delta modulator operating at a sample frequency, comprising:
a first adder, for generating a difference value between a digital input value presented at the sample frequency, and a feedback value;
a quantizer, for quantizing the difference value from the first adder;
a second adder, for adding the quantized difference value to the digital input value and producing a modulated output;
a feedback adder, for generating a feedback difference between the difference value and the quantized difference value; and a digital filter function, for applying a noise transfer function to the feedback difference value to generate the feedback value.

21. The digital band-pass sigma-delta modulator of claim 20, wherein the sample frequency corresponds to a multiple of a transmit frequency;
and wherein the noise transfer function has a selected band-pass characteristic centered at a frequency corresponding to the transmit frequency, and has at least one notch corresponding to a desired suppression frequency.

22. The digital band-pass sigma-delta modulator of claim 21, wherein the noise transfer function has first and second notches that are symmetrically spaced from the centered frequency.

23. The digital band-pass sigma-delta modulator of claim 21, wherein the noise transfer function has first and second notches that are asymmetrically spaced from the centered frequency.

24. A circuit for applying a digital finite impulse response filter and for generating an output signal responsive to a multiple bit input signal, the circuit comprised of a plurality of sub-arrays, each associated with one bit of the input signal, each of the plurality of sub-arrays comprising:
a sequence of delay stages;
a plurality of power transistors, each having a source-drain path connected on a first side to an output node, and having a gate electrode biased to a bias voltage; and
a plurality of switching transistors, each associated with one of the plurality of power transistors, having a source-drain path connected between a second side of the source-drain path of its associated power transistor and a reference voltage, and having a gate electrode coupled to an output of a selected one of the sequence of delay stages.

25. The circuit of claim 24, wherein each of the plurality of sub-arrays further comprises:
a plurality of gain control blocks, each coupled between the output of a selected one of the sequence of delay stages and a gate electrode of an associated one of the plurality of switching transistors.

26. The circuit of claim 25, wherein the plurality of power transistors are arranged in groups, each group associated with one of the selected ones of the sequence of delay stages;
wherein the plurality of switching transistors are arranged in groups, each group associated with one of the selected ones of the sequence of delay stages, and each of the plurality of switching transistors in a group associated with one of the plurality of power transistors in its associated group.

27. The circuit of claim 26, wherein each of the gain control blocks is associated with one of the groups of the plurality of power transistors and its associated group of the plurality of switching transistors;
and wherein each gain control block comprises:
a plurality of logic functions, each for combining a bit of a gain control word with a logic state presented at the output of the selected one of the sequence of delay stages, and having an output coupled to the gate of one of the group of the plurality of switching transistors.

28. The circuit of claim 27, wherein each group of the plurality of switching transistors comprises switching transistors of different drive;
wherein one of the switching transistors in the group having a highest drive is associated with a most significant bit of the gain control word.

29. The circuit of claim 28, wherein multiple combinations within each group of the plurality of switching transistors provide equivalent drive;

and further comprising:

a controller for applying alternating values of the gain control word among the multiple combinations.

30. The circuit of claim 28, wherein first and second ones of the switching transistors within each group of the plurality of switching transistors correspond to the smallest drive;

and further comprising:

a controller for applying alternating values of the gain control word to select between the first and second ones of the switching transistors.

31. The circuit of claim 24, wherein each of the plurality of power transistors comprises a drain extended MOS transistor.

* * * * *